United States Patent [19]

Penrod et al.

[11] 4,139,726

[45] Feb. 13, 1979

[54] PACKAGED MICROCIRCUIT AND METHOD FOR ASSEMBLY THEREOF

[75] Inventors: Orville R. Penrod, Muskego; Richard R. Fellows, Jr., Oak Creek, both of Wis.

[73] Assignee: Allen-Bradley Company, Milwaukee, Wis.

[21] Appl. No.: 869,538

[22] Filed: Jan. 16, 1978

[51] Int. Cl.$^2$ ............................................. H05K 5/06
[52] U.S. Cl. ................................. 174/52 FP; 29/589; 357/74
[58] Field of Search ................. 174/52 FP, 52 PE; 357/72, 74; 29/588, 589; 339/103 R, 103 C, 103 M

[56] References Cited

U.S. PATENT DOCUMENTS

| 3,312,771 | 4/1967 | Hessinger et al. | 174/52 FP |
|---|---|---|---|
| 3,320,351 | 5/1967 | Glickman | 174/52 FP |
| 3,469,684 | 9/1969 | Keady et al. | 174/52 FP |
| 3,548,076 | 12/1970 | Cooke | 174/52 FP |
| 3,873,890 | 3/1975 | Beckman et al. | 317/101 CC |
| 3,939,558 | 2/1976 | Riley | 174/52 FP |
| 4,012,579 | 3/1977 | Fox et al. | 174/52 PE |
| 4,012,835 | 3/1977 | Wallick | 174/52 FP |

Primary Examiner—J. V. Truhe
Assistant Examiner—D. A. Tone
Attorney, Agent, or Firm—Quarles & Brady

[57] ABSTRACT

A packaged microcircuit includes a housing of insulating material having a plurality of apertures which extend from the interior of the housing to the outside. A metallized lead connection surface is formed on a wall of each aperture. A microcircuit having a plurality of terminals is disposed in the interior of the housing with each of its terminals aligned with a respective aperture. The individual leads extend into the apertures and are soldered to both the terminals and the housing. The first solder connection electrically connects each lead to the terminal aligned with the aperture and the second solder connection anchors each lead to the metallized surface of the housing to absorb mechanical stress applied to an outwardly extending portion of the lead.

13 Claims, 6 Drawing Figures

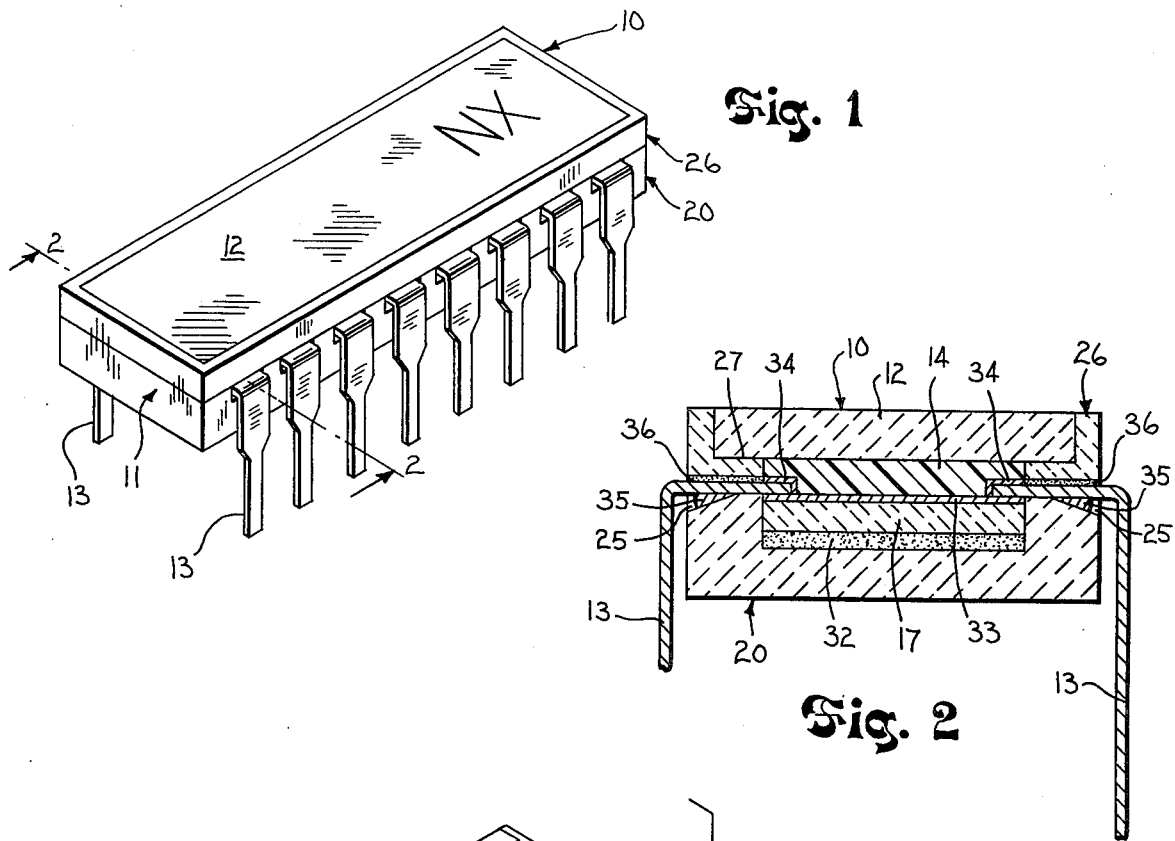
Fig. 1
Fig. 2
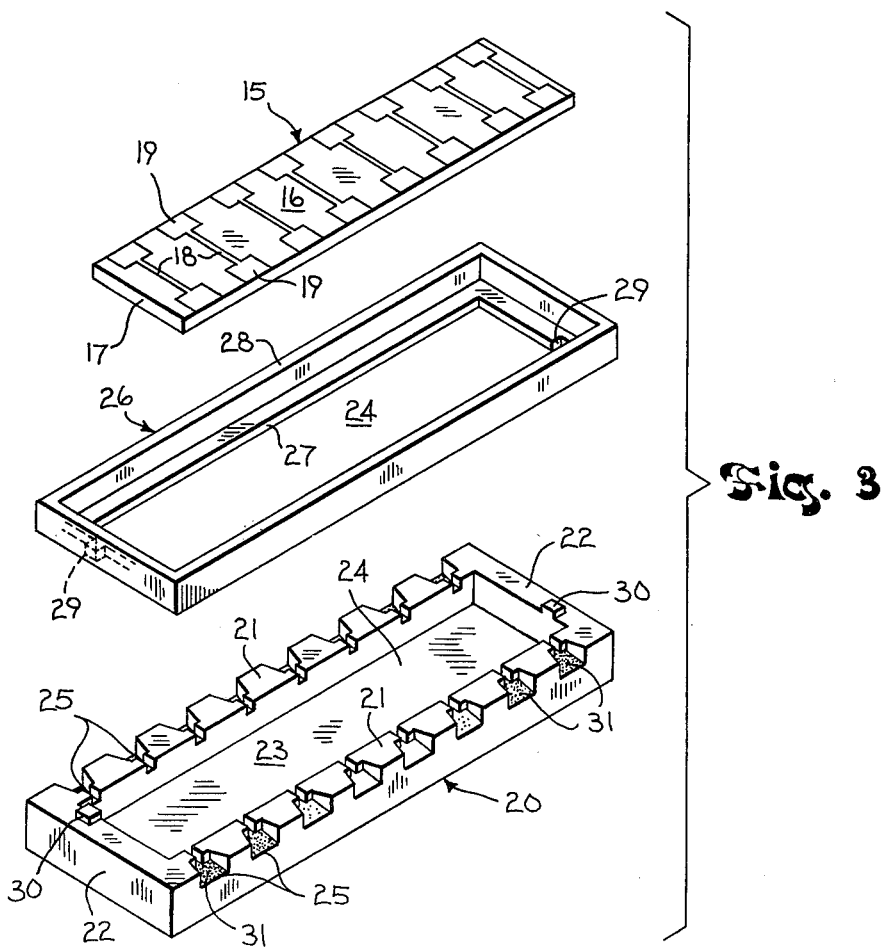
Fig. 3

PACKAGED MICROCIRCUIT AND METHOD FOR ASSEMBLY THEREOF

BACKGROUND OF THE INVENTION

The invention relates to a packaged microcircuit, more particularly, to a packaged thin film microcircuit, and a method for assembling a thin film microcircuit in such a package.

There are now available high precision thin film resistor microcircuits and thin film hybrid microcircuits of resistors with bonding pads for attachment to capacitors and integrated circuits. A microcircuit chip is formed by depositing a film from two hundred to three hundred Angstroms in thickness on a substrate a few hundredths of an inch in thickness. Thin film resistive microcircuits have been designed to meet extremely low tolerances. While these circuits perform to specification in the laboratory, proper packaging is necessary for these microcircuits to perform satisfactorily in operating environments.

Besides temperature, humidity, vibration and fatigue, these microcircuits must be protected from stress and strain, if they are to perform within specification limits. In electrical devices such as disclosed in Beckman et al, U.S. Pat. No. 3,873,890, a relatively thick substrate is employed which resists deflection or deformation resulting from stress applied to the leads. In typical thin film microcircuits stress applied to the leads can deflect or deform the relatively thin substrate a slight amount if the leads are soldered or otherwise connected in a conventional manner to terminals on the microcircuit chip. This deformation, in turn, is transferred to the elements of the microcircuit itself, causing a variance in resistance due to the change of shape of the resistive film. Even the seemingly slight mechanical stress and strain applied to the leads during insertion into a circuit board can cause unacceptable changes in resistance unless measures are taken in the packaging of the microcircuit chip to insulate it from stress and strain.

In the prior art a technique called "wire bonding" is well known. In wire bonding a relatively smaller microcircuit is disposed on a relatively larger substrate and fine metallic wires, usually made of gold or aluminum, are formed on the substrate to connect the microcircuit to a set of terminals disposed along an edge of the substrate. In packaging the microcircuit and substrate, leads are soldered to the terminals. In this arrangement stress applied to the leads may be applied to the substrate, but the deformation or deflection of the substrate occurs near its edges, rather than in the center of the substrate where the circuit is disposed.

Another prior art technique for protecting the microcircuit and substrate from stress applied to the leads is described in Glickman, U.S. Pat. No. 3,320,351, where a plurality of metallic leads are rigidly connected to a metal housing by a fused glass seal.

The described prior art techniques protect the microcircuit from external stress to some extent; however, a need remains for a simple, inexpensively packaged microcircuit having a housing of insulating material in which the microcircuit substrate and connections thereto are protected from stress applied to the leads and other adverse conditions.

SUMMARY OF THE INVENTION

A general object of the invention is to provide a packaged microcircuit in which the microcircuit and its electrical connections are protected from stress and strain applied to the leads and a method of assembling such a package.

The invention contemplates a packaged microcircuit which includes a housing of insulating material having at least one aperture extending from the interior of the housing to the outside, and a metallized surface formed in the aperture, a microcircuit having a plurality of terminals disposed in the interior of the housing, at least one of the terminals being aligned with the aperture of the housing, a lead extending from the outside into the aperture, and a plurality of solder connections, a first solder connection electrically connecting the lead to the terminal, and a second solder connection mechanically connecting the lead to the metallized surface of the housing to absorb stress applied to the lead and to insulate the microcircuit and its electrical connection to the lead from such stress.

The use of a solder joint to connect the lead to the housing and form a stress-absorbing connection is a unique feature of the present invention. This type of solder joint can be used solely as a mechanical connection or as a mechanical-electrical connection depending upon the structure of the housing.

In a first specific embodiment the packaged microcircuit includes a two-part housing of insulating material. The microcircuit and substrate are received in a cavity in the housing and the apertures extend through opposite side walls of the housing into the cavity. A metallized lead connection surface is formed on a wall in each aperture. The leads extend through the apertures to terminals of the microcircuit which are each aligned with a respective aperture. Two solder joints are formed for each lead, a first solder joint being formed in the cavity to electrically connect the lead to the terminal and a second solder joint being formed in the aperture to mechanically connect the lead to the housing. The microcircuit is then encapsulated in the housing by disposing a potting compound and a cover in the housing cavity.

In the preferred method of the present invention both solder joints are formed in a single soldering operation. The housing, microcircuit and leads are immersed in a solder bath and solder adheres to the metallized surfaces, such as the lead connection surfaces and the terminals, but does not adhere to other surfaces. By using a housing of insulating material, and by providing a metallic film on the aperture walls, solder can be selectively applied to the housing to form support connections for the leads. The need for additional materials and manufacturing processes to reinforce the leads is eliminated. The solder does not extend outside the apertures, thus permitting the leads to be bent parallel to the sides of the housing. If necessary, the circuit can be cleaned and electrically calibrated through the cavity after the soldering operation and before the potting compound is added. The size of the cavity opening is a feature which greatly facilitates these operations.

It is a further object of the invention to provide apertures and lead tips with shapes that will control the depth of penetration of the lead tips into the apertures and assist in holding the leads in place during assembly. This feature aids in manufacturing the packaged microcircuit in that leads are usually inserted on a lead frame and some means of seating and retaining them in the aperture is helpful.

Other objects and advantages of the invention will become apparent from the drawings, description and claims that follow.

BRIEF DESCRIPTION OF THE DRAWINGS

FIG. 1 is a perspective view of a packaged microcircuit which incorporates the present invention;

FIG. 2 is a transverse sectional view of the packaged microcircuit taken in the plane indicated by line 2—2 in FIG. 1;

FIG. 3 is an exploded view of the package housing and the microcircuit of FIG. 1;

DESCRIPTION OF THE PREFERRED EMBODIMENTS

Figure 4:
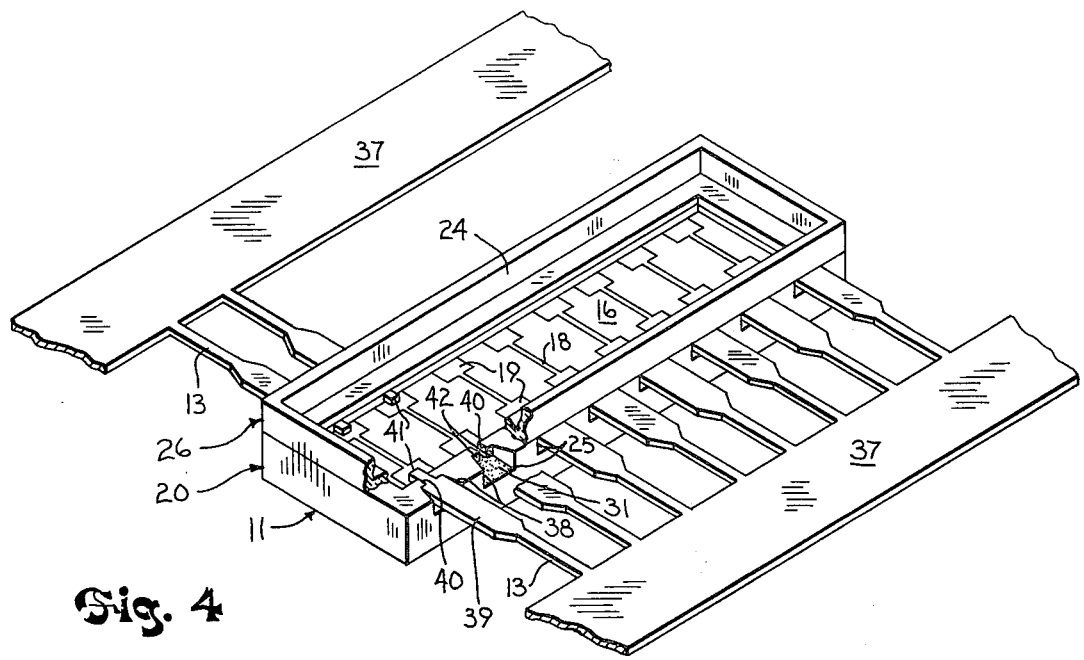
FIG. 4 is a perspective view with parts cut away of the microcircuit of FIG. 1 during assembly.

FIGS. 1-4 relate to a preferred embodiment of the present invention. Referring particularly to FIG. 1 a packaged microcircuit 10 includes a two-part housing 11, a cover 12 attached to the housing and two sets of metal leads 13, each set being disposed along a longitudinal side of the housing 11 opposite the other. The circuit configuration is generally referred to as a dual-in-line (DIP) package. Although both embodiments described herein are DIP packages, it should be apparent from the following description that the invention is applicable to other packages containing leads along one longitudinal side, or containing leads disposed at other locations. It should also be apparent to those skilled in the art that many different types of lead wires or pin connectors can be used in practicing the invention.

The circuit to be encapsulated is shown in FIG. 3 as part of a microcircuit 15 which includes a thin film microcircuit 16 disposed on a glass substrate 17. The microcircuit 16 is an integrated film of chromium cobalt which is vacuum deposited on the substrate 17. The microcircuit is formed in paths 18 between terminals 19, spaced apart along opposite sides of the substrate 17, each path 18 being formed of a resistive material which functions as a resistive element in an electric circuit. The terminals 19 are areas of metallic film which are fired on the substrate 17 in the manner well known to those skilled in the art. Although the substrate in this embodiment is made of glass, ceramics and other substrate materials well known in the art could be substituted for glass in making the substrate.

The present invention is primarily concerned with the susceptibility of this type of circuit to mechanical stress and strain, and to a lesser degree is concerned with other environmental factors which are reasons for encapsulating electronic circuits. Due to the small area coverage and slight thickness of the microcircuit 16, the latter being in the range of 200-300 Angstroms, any deformation of the substrate 17 can cause a corresponding change in the dimensions of the microcircuit 16, and a change in the resistance of circuit components. Although the invention is described with respect to a particular type of circuit, it should be understood by those skilled in the art, that the invention can be practiced with many other types of electronic circuits, whether resistive components are included or not.

Besides the circuit chip 15, FIG. 3 shows the details of the two-part housing 11 which forms a part of the DIP package 10. Both parts of the housing 11 are preferably made of a ceramic insulating material. The bottom part of the housing 11 is a carrier 20 which includes a pair of spaced apart longitudinal side walls 21 connected between a pair of spaced apart transverse side walls 22 and a planar member 23 disposed between the side walls 21, 22 to close the bottom of the carrier 20. The side walls 21, 22 rise above the bottom member 23 to define a portion of a housing cavity 24 therebetween. A plurality of apertures 25 are formed in each of the oppositely disposed longitudinal side walls 21 to receive the leads 13 for the package 10. The top part of the housing 11 is a window frame 26 having generally the shape defined by the connected side walls 21, 22 of the carrier 20. The frame 26 includes a continuous, bottom facing, ledge member 27 and a continuous, side facing member 28. The frame members 27, 28 define a portion of the cavity 24 when the frame 26 and the carrier 20 are assembled. The frame 26 is located on the carrier 20 by a pair of recesses 29 formed in oppositely disposed segments of the ledge member 27, the recesses 29 each receiving one of a pair of integrally molded projections 30 formed on the carrier 20.

Before the package 10 is assembled, a plurality of lead connection surfaces 31 are formed on the carrier 20 by applying a metallic film, preferably a silver paste, to a wall formed in each of the apertures 25. This metallizing step is more easily performed with the carrier 20 of the present invention in which the apertures 25 are open channels before the window frame 26 is disposed on the carrier 20. Rollers of various kinds known in the art may then be employed to apply the paste. The film is fired on in a manner well known in the art. See Beckman et al, U.S. Pat. No. 3,873,890 (Column 4, lines 15-31). Metallization is provided within the apertures 25 in anticipation of a soldering operation. Solder adheres to the metallized surfaces 31 and to the metal film of the terminals 19 to form solder connections but does not adhere to nonmetallized surfaces of the housing 11. The term "metallized" as used herein to refer to materials or surfaces shall be understood to include any material or surface to which solder adheres.

As seen in FIG. 2 in section, the assembled package 10 includes, from the bottom upward, the carrier 20, an adhesive layer 32, the substrate 17 adhered to the adhesive layer 32, a conductive path 33 formed by a pair of terminals 19 and the resistive path 18 connected therebetween, a lead 13 inserted into an aperture 25 on each longitudinal side of the housing 11, connected to the conductive path 33 by a first solder joint 34, and connected to the housing by a second solder joint 35, an adhesive layer 36 between the carrier 20 and the frame 26, a potting compound 14, and the cover 12.

Referring now to FIGS. 2 and 3, the first step in assembling the package 10 is to attach the frame 26 to the carrier 20. An epoxy adhesive is deposited on a top surface of the carrier 20. The frame 26 is located on the carrier 20 by the mating of the recesses 29 and the projections 30. The housing assembly 11 is then allowed to cure to form the adhesive layer 36 as seen in FIG. 2. Other suitable adhesives can be used to attach the frame 26 and the carrier 20, and, in fact, other methods of joining the two parts can be employed.

Following the assembly of the housing 11, the microcircuit chip 15 is secured in place by adhesively attaching the substrate 17 to the housing 11. As shown in FIG.

2, a layer of adhesive 32 is applied to the bottom member 23 of the carrier 20, the substrate 17 is placed in the cavity 24, and the assembly is cured. Epoxy resins are suitable materials for this purpose although silicone and other adhesives could be substituted in other embodiments of the invention.

As seen in FIG. 4, the microcircuit 16 is positioned in the housing cavity 24 with the terminals 19 each aligned with a respective one of the apertures 25. The leads 13 are inserted into the apertures 25 with each lead 13 extending inwardly through a respective one of the apertures 25 into the cavity 24 to contact the terminal 19 aligned therewith. In this embodiment the leads 13 are not bent and are carried by a lead frame 37, which is used as a matter of convenience. Prebent leads may also be used, while the lead frame need not be used in all embodiments.

The leads 13 and the apertures 25 in FIG. 4 have shapes which control the depth of penetration of the leads 13 into the housing 11 and assist in holding the leads 13 in place during assembly. The apertures 25 each have a tapered lead recess 38 which receives a lead tip 39. The apertures 25 also have a narrower slot 40 disposed inwardly from the lead recess 38 through which a lead tip extension 41, which is narrower than the standard tip 39, extends to contact the terminal 19 aligned therewith. A pair of shoulders 42 are formed at the junction of the lead recess 38 and the slot 40. Each lead 13 is inserted to a position where the standard tip portion 39 is blocked from further penetration by the shoulders 42, and the lead 13 becomes seated in the aperture 25.

The circuit assembly of FIG. 4 is then immersed in a solder bath to a depth sufficient to form solder connections to the metallized surfaces 31 and to the terminals 19. Solder does not normally wick through the aperture slots 40 and thus double solder connections are formed, a first solder joint 34 connecting each lead 13 to the terminal 19 aligned with the aperture 25, and a second solder joint 35 connecting each lead 13 to the housing 11 as shown in FIG. 2. The extra solder connections 35 to the housing 11 divert stress and strain applied to the leads 13 and insulate the terminal solder connections 34 from such stress and strain. Even if some wicking through the aperture slots 40 occurs in the soldering operation, the solder connection is still a double connection in the sense just described. The circuit assembly is removed from the solder bath to allow the solder connections to cool and solidify. Solder does not adhere to, or is easily removed from, the nonmetallized portions of the housing 11.

If in the method of assembly the leads 13 are attached to a lead frame 37 as shown in FIG. 4, the leads 13 are severed from the lead frame 37 and the leads bent to the position shown in FIG. 2. Either of these two steps can be performed before the other. The nonadherence of solder to the exterior surface of the housing 11 permits the leads 13 to be bent parallel to the exterior surface as shown in FIG. 2. In soldering operations in the prior art, solder could form outside an aperture and block the bending of the leads to this position.

After soldering and bending the leads, several housekeeping steps are performed before final encapsulation. The microcircuit 16 may be cleaned, if necessary, through the cavity 24 which is still open to the outside of the housing 11. The microcircuit 16 may also be tested and adjusted by trimming, if necessary. Preferably the cavity opening 24 is as large as the area of the microcircuit 16 to permit easy access for cleaning and trimming.

Referring again to FIG. 2, the final assembly step is disposing a sufficient amount of potting compound 14 in the cavity 24 to completely cover the microcircuit 16 and disposing the cover 12 in the cavity 24 on the window ledge 27 and on top of the compound 14. The cover 12 may be premonogrammed as shown in FIG. 1 if desired, or the cover 12 may be omitted. The potting compound 14 is then allowed to solidify, thereby attaching the cover 12 and encapsulating and protectively sealing the microcircuit 16. A suitable potting compound is a liquid insulating material such as a silicone resin, or an epoxy resin, which will flow into voids and spaces and then solidify to seal the microcircuit 16 in the housing 11. Other suitable materials can also be used.

Figure 5:
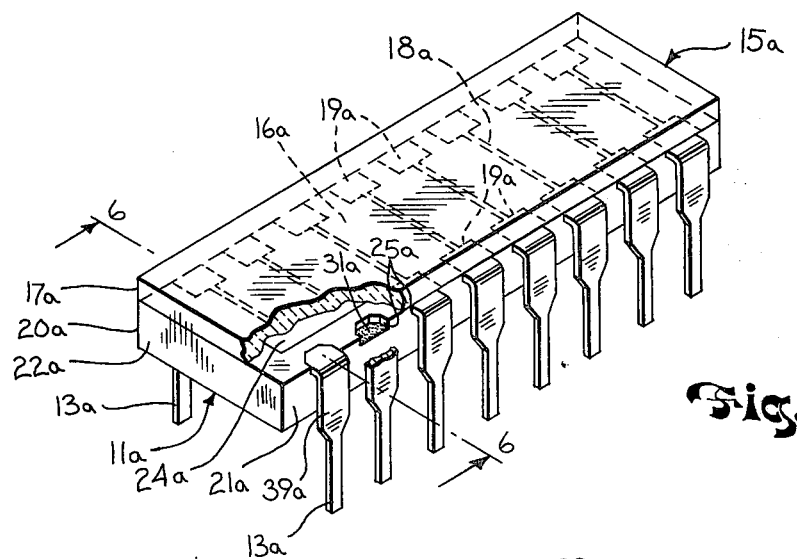
FIG. 5 is a perspective view with parts cut away of another embodiment of a packaged microcircuit which incorporates the present invention.
Figure 6:
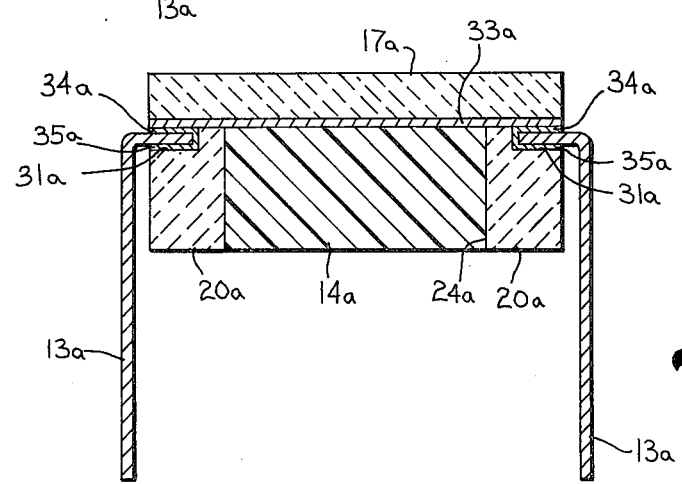
FIG. 6 is a transverse sectional view of the microcircuit of FIG. 5 taken along the plane indicated by line 6—6 in FIG. 5.

In a second embodiment shown in FIGS. 5 and 6 the housing 11a includes a carrier 20a and a cover which is also the support or substrate 17a for the microcircuit 16a. The carrier 20a has two spaced apart longitudinal side walls 21a connected by two spaced apart transverse side walls 22a. The carrier 20a has an opening which when covered on one side by the substrate 17a forms a cavity 24a in the housing 11a. The microcircuit 16a is disposed on the underside of the cover 17a, and faces the open side of the carrier 20a from the depth of the cavity 24a. The substrate 17a is attached to the carrier 20a by an adhesive which is not shown. The housing 11a has a plurality of spaced apart apertures 25a in each of the longitudinal side walls 21a. The apertures 25a extend into, but not through the side walls 21a. As in the first embodiment each terminal 19a is aligned with a respective aperture 25a. And like the first embodiment, a surface 31a is formed in each aperture 25a and a metallic film is applied to the surface 31a.

As seen in section in FIG. 6, the leads 13a are each attached by a double solder connection, a first solder connection 34a connecting the lead 13a to a conductive path 33a formed by a pair of terminals 19a and a resistive path 18a connected therebetween, and a second solder connection 35a connecting the lead 13a to one of the metallized surfaces 31a of the housing.

Referring again to FIG. 5, the packaged microcircuit 10a is assembled as follows. A metallic film is applied to the surfaces 31a formed in the apertures 25a. The cover 17a with the microcircuit 16a facing downward into the carrier opening 24a is adhesively mounted to the carrier 20a with an epoxy or other suitable adhesive, and the adhesive, not shown, is allowed to cure. The cover may be premonogrammed if desired. The tips 39a of the leads 13a are then inserted into the apertures 25a and the assembly is immersed in a solder bath to a depth sufficient to form the solder connections 34a, 35a, as shown in FIG. 6, and then removed to allow the connections 34a, 35a to cool and solidify. The leads 13a are bent, and cleaning and electrical calibration are performed, if necessary, through the cavity opening 24a. Finally, a silicone resin or another potting compound 14a is placed in the cavity 24a to cover the microcircuit 16a and allowed to solidify. Preferably, the compound 14a fills the cavity 24a making a bottom cover unnecessary.

Like the first embodiment, each solder connection is a double solder connection in that it connects the lead 13a to both the housing 11a and the terminal 19a. This makes a stronger connection than a connection to the terminal 19a alone, preventing stress from being transferred to the circuit 16a or the substrate 17a. In this embodiment fewer components and processes are needed to manufacture the housing 11a which provides further economy in packaging the microcircuit chip 15a. The packaged microcircuit 10a can be made smaller than the packaged microcircuit 10 of the first embodiment for the same substrate because the carrier 20a may have the same lateral dimensions as the substrate 17a. Cleaning and electrical calibration can again be performed via the cavity opening 24a before the potting compound 14a is added. In this embodiment the cavity opening 24a is approximately as large as the area of the microcircuit 16a excluding its terminals 19a. As in the method of manufacturing the first embodiment, the dual objectives of electrically connecting the leads and structurally reinforcing them, can be accomplished in a single soldering step.

The steps in assembling the packaged microcircuit have been related in their preferred sequence. It should be apparent, however, that this sequence may be altered without departing from the spirit of the invention. For example, in assembling the first embodiment the microcircuit could be disposed in the carrier 20 and the leads 13 attached before the window frame 26 is attached to the carrier 20.

Although the invention has been described in connection with a thin film microcircuit there may be instances in which it would be advantageous to package a thick film microcircuit in a similar manner. It should also be understood by those skilled in the art that other embodiments may be used to practice the described invention, and therefore, reference should be made to the following claims to determine the scope of the invention.

We claim:
1. A packaged microcircuit which comprises:
a housing of insulating material having at least one aperture extending from the interior of the housing to the outside, and a metallized surface formed in the aperture;
a microcircuit having a plurality of terminals disposed in the interior of the housing, at least one of the terminals being aligned with the aperture of the housing;
a lead extending from the outside into the aperture; and
a plurality of solder connections, a first solder connection electrically connecting the lead to the terminal, and a second solder connection mechanically connecting the lead to the metallized surface of the housing to absorb stress applied to the lead and to insulate the microcircuit and its electrical connection to the lead from such stress.

2. A packaged microcircuit which comprises:
a housing of insulating material having a cavity, a plurality of apertures, and a metallized surface located in one of the apertures;
a microcircuit within the cavity having a plurality of terminals, each terminal being aligned with a respective one of the apertures;
a plurality of leads, each extending into a respective one of the apertures and proximate to the terminal aligned therewith; and
a plurality of solder connections electrically connecting the leads to the terminals and at least one solder connection mechanically connecting one of the leads to the metallized surface of the housing to absorb stress applied to that lead and to insulate the microcircuit and its electrical connection to that lead from such stress.

3. The packaged microcircuit of claim 2, wherein each aperture extends through a wall of the housing into the cavity and the terminal aligned with the aperture is disposed within the cavity adjacent to the aperture.

4. The packaged microcircuit of claim 3, wherein the housing includes a carrier having a wall in which the apertures are formed, a planar member disposed next to the wall to support a microcircuit thereby, and a window frame disposed on the carrier to partially enclose the apertures.

5. The packaged microcircuit of claim 4, wherein:
each aperture has an outer recess and a narrower slot inwardly disposed from the recess, a shoulder being formed at the junction of the recess and the slot, and
wherein each lead has a tip extending into the recess and a narrower tip extension which extends through the slot to the terminal, the lead being inserted into the aperture until stopped by the shoulder and seated in the aperture.

6. The packaged microcircuit of claim 2, wherein each terminal forms a part of the surface which defines the aperture aligned with it.

7. The packaged microcircuit of claim 6, wherein the housing includes a carrier having an opening which passes through it; and wherein the microcircuit is disposed on a substrate which covers an open side of the housing to form the housing cavity.

8. An encapsulated microcircuit having a housing of insulating material sealed with a compound, the housing including a plurality of apertures, a microcircuit disposed in the housing, the microcircuit having a plurality of terminals each aligned with a respective one of the apertures, and a plurality of leads each extending inwardly into a respective one of the apertures proximate to the terminal aligned therewith, characterized in that:
the housing includes a metallized surface formed in at least one of the apertures;
a plurality of solder connections are each formed between a respective one of the leads and the terminal proximate thereto; and
a solder connection is formed between the metallized surface and the lead disposed in the aperture with the metallized surface to absorb stress applied to the lead and to insulate the microcircuit and the electrical connection to that lead from such stress.

9. The encapsulated microcircuit of claim 8, further characterized in that the housing has a cavity in which the microcircuit is disposed, the cavity having an opening to the outside at least as large as the area of the microcircuit excluding its terminals, and further characterized in that the compound is disposed in the cavity to seal the microcircuit in the housing.

10. A method for packaging a microcircuit in a housing of insulating material having a cavity and a plurality of spaced apart apertures therein, comprising the steps of:
forming a plurality of metallized lead connection surfaces, each disposed in a respective one of the apertures;
positioning the microcircuit in the cavity with each of its terminals aligned with a respective one of the apertures;
inserting a plurality of leads into the apertures, each lead extending inwardly into a respective one of the apertures and proximate to the terminal aligned therewith to form a circuit assembly;

forming a plurality of solder connections, a first set of solder connections electrically connecting the leads to the terminals, and a second set of the solder connections mechanically connecting the leads to the metallized lead connection surfaces to protect the microcircuit and its terminal connections from stress applied to the leads, and disposing a compound in the cavity to cover the microcircuit and allowing the compound to solidify, thereby encapsulating the microcircuit.

11. The method of claim 10 wherein the soldering step comprises:

immersing the circuit assembly in a solder bath to a depth sufficient to form the solder connections; and removing the circuit assembly from the solder bath and allowing the solder connections to cool and solidify.

12. The method of claim 10, which includes cleaning the microcircuit after the solder connections are formed.

13. The method of claim 10, which includes electrically calibrating the microcircuit after the solder connections are formed.

* * * * *